(12) United States Patent
Xiao et al.

(10) Patent No.: US 10,886,935 B2
(45) Date of Patent: Jan. 5, 2021

(54) SAR-DAC DEVICE AND METHOD FOR OPERATING AN SAR-DAC DEVICE

(71) Applicants: Semiconductor Manufacturing International (Shanghai) Corporation, Shanghai (CN); Semiconductor Manufacturing International (Beijing) Corporation, Beijing (CN)

(72) Inventors: Yan Xiao, Shanghai (CN); Qian Weng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/704,754

(22) Filed: Dec. 5, 2019

(65) Prior Publication Data

US 2020/0228134 A1  Jul. 16, 2020

(30) Foreign Application Priority Data

Jan. 10, 2019 (CN) .......................... 2019 1 0024370

(51) Int. Cl.
*H03M 1/80* (2006.01)
*H03M 1/72* (2006.01)

(52) U.S. Cl.
CPC ............. *H03M 1/802* (2013.01); *H03M 1/72* (2013.01)

(58) Field of Classification Search
CPC ......... H03M 1/802; H03M 1/804; H03M 1/72
USPC .......................... 341/144, 155, 163, 135, 153
See application file for complete search history.

(56) References Cited

U.S. PATENT DOCUMENTS

2016/0056832 A1\* 2/2016 Deloge ............... H03M 1/0881
375/219
2019/0181874 A1\* 6/2019 Loveless .................. H03K 5/24

\* cited by examiner

*Primary Examiner* — Peguy Jean Pierre
(74) *Attorney, Agent, or Firm* — Anova Law Group, PLLC

(57) ABSTRACT

SAR-DAC devices and operation methods of SAR-DAC devices are provided. An exemplary SAR-DAC device includes a comparator having a positive input terminal and a negative input terminal; and a DAC core unit including a first capacitor, a second capacitor, and a current-controlled discharging structure. The first capacitor includes a first charging-discharging terminal. The second capacitor includes a second charging-discharging terminal. The current-controlled discharging structure includes current beam circuit units. Each current beam circuit unit includes a first discharging input terminal connected to the first charging-discharging terminal and a second discharging input terminal connected to the second charging-discharging terminal. The current-controlled discharging structure is configured to discharge the first capacitor through the first discharging input terminal by using at least some of the current beam circuit units; and to discharge the second capacitor through the second discharging input terminal using at least some of the current beam circuit units.

20 Claims, 4 Drawing Sheets

SAR-DAC DEVICE AND METHOD FOR OPERATING AN SAR-DAC DEVICE

CROSS-REFERENCES TO RELATED APPLICATIONS

This application claims the priority of Chinese patent application No. 201910024370.1, filed on Jan. 10, 2019, the entirety of which is incorporated herein by reference.

FIELD OF THE DISCLOSURE

The present disclosure generally relates to the field of integrated circuits (ICs) and, more particularly, relates to SAR-DAC devices and methods for operating SAR-DAC devices.

BACKGROUND

Due to the increasing demands for high-quality multimedia and high-speed communication, digital-to-analog converters (DACs) are designed toward high precision, high sampling rate, and low power-consumption. Among them, the low power-consumption design is especially important for portable devices.

The successive approximation digital-to-analog converter (SAR-DAC) is a well-recognized low-power DAC device. Although the approximation type of digital-to-analog converter has a moderate speed and medium accuracy, the successive approximation analog-to-digital converter is widely used because of its low power-consumption, which can satisfy most of the market needs.

However, there is a need to further improve the performance of successive approximation analog-to-digital converters. The disclosed SAR-DAC devices and methods for operating SAR-DAC devices are directed to solve one or more problems set forth above and other problems in the art.

BRIEF SUMMARY OF THE DISCLOSURE

One aspect of the present disclosure includes an SAR-DAC device. The SAR-DAC device may include a comparator having a positive input terminal and a negative input terminal; and a DAC core unit including a first capacitor, a second capacitor, and a current-controlled discharging structure. The first capacitor may include a first charging-discharging terminal connected to the positive input terminal. The second capacitor may include a second charging-discharging terminal connected to the negative input terminal. The current-controlled discharging structure may include a plurality of current beam circuit units; each of the plurality of current beam circuit units may include a first discharging input terminal and a second discharging input terminal; each first discharging input terminal may be connected to the first charging-discharging terminal; and each second discharging input terminal may be connected to the second charging-discharging terminal the current-controlled discharging structure may be configured to discharge the first capacitor through the first discharging input terminal by using at least a portion of the current beam circuit units. The current-controlled discharging structure may be further configured to discharge the second capacitor through the second discharging input terminal using at least a portion of the current beam circuit units.

Another aspect of the present disclosure includes an operation method of an SAR-DAC device. The method may include providing an SAR-DAC device. The SAR-DAC device may include a comparator having a positive input terminal and a negative input terminal; and a DAC core unit including a first capacitor, a second capacitor, and a current-controlled discharging structure. The first capacitor may include a first charging-discharging terminal connected to the positive input terminal. The second capacitor may include a second charging-discharging terminal connected to the negative input terminal. The current-controlled discharging structure may include a plurality of current beam circuit units; each of the plurality of current beam circuit units may include a first discharging input terminal and a second discharging input terminal; each first discharging input terminal may be connected to the first charging-discharging terminal; and each second two discharging input terminal may be connected to the second charging-discharging terminal the current-controlled discharging structure may be configured to discharge the first capacitor through the first discharging input terminal by using at least a portion of the current beam circuit units. The current-controlled discharging structure may be further configured to discharge the second capacitor through the second discharging input terminal using at least a portion of the current beam circuit units. The method may also include performing a first comparison step to an Nth comparison step, N is an integer greater than or equal to 2. In each comparison step, the comparator may compare a potential of the positive input terminal with a potential of the negative input terminal, and outputs a comparison result. The method may also include performing a first discharging step to an (N−1)-th discharging step. In each discharging step, one of the first charging-discharging terminal and the second charging-discharging terminal having a higher potential is discharged. After the first comparison step, the first discharging step may be performed. After the j-th discharging step, the (j+1)-th comparison step may be performed. j is an integer greater than or equal to 1 and less than or equal to N−1. In the current-controlled discharging structure, a total number of current beam circuit units may be equal to 2N−2; and in the j-th discharging step, a number of operations using the current beam circuit unit may be 2N−j−1.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
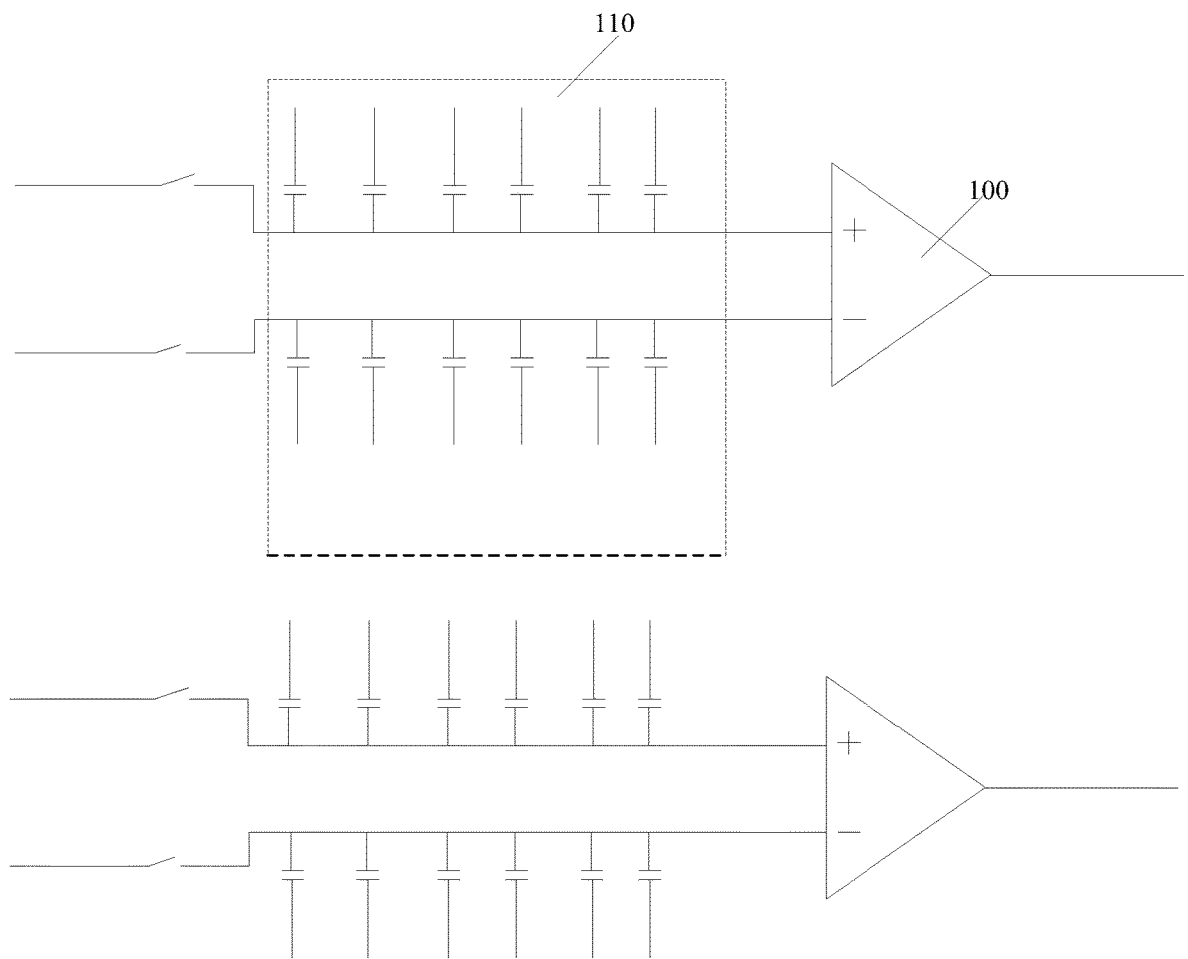
FIG. 1 illustrates a successive approximation digital-to-analog converter (SAR-DAC) device.

FIG. 1 illustrates a successive approximation digital-to-analog converter (SAR-DAC) device. As shown in FIG. 1, an SAR-DAC device includes two circuit units. Each circuit unit includes a comparator 100, a capacitor matrix unit 110, and a sampling switch.

Because more than one circuit unit is employed, the number of times of charge redistributions is reduced under a same number of comparisons. Accordingly, the speed of the SAR-DAC device is improved.

However, for a five-bit precision data, a number 64 of 90fF capacitors are used in one capacitor matrix unit 110, and the layout area in the SAR-DAC device is mostly occupied by the capacitor matrix unit 110. The circuit unit having two circuits allows the SAR-DAC device to have two capacitor matrix units 110, and the total area of capacitor matrix may be substantially large. Thus, the layout area of the SAR-DAC device is relatively large, and the cost of the SAR-DAC device is increased.

The present disclosure provides an SAR-DAC device and a method for operating an SAR-DAC device. The SAR-DAC device may include a comparator having a positive input terminal and a negative input terminal, and a DAC core unit. The DAC core unit may include a first capacitor and a second capacitor. The first capacitor may have a first charging-discharging terminal. The first charging-discharging terminal may be connected to the positive input terminal. The second capacitor may have a second charging-discharging terminal, and the second charging-discharging terminal may be connected to the negative input terminal. The SAR-DAC device may also include a current-controlled discharging structure. The current-controlled discharging structure may include a plurality of current beam circuit units. Each of the plurality of current beam circuit units may include a first discharging input terminal and a second discharging input terminal, and the first discharging input terminal may be connected to the first charging-discharging terminal. Each second discharging terminal may be connected to the second charging-discharging terminal. The current-controlled discharging structure may be configured to discharge the first capacitor through the first discharging input terminal using at least a portion of the current beam circuit units. The current-controlled discharging structure may also be configured to discharge the second capacitor through the second discharging input terminal using at least a portion of the current beam circuit units. The performance of the SAR-DAC device may be improved.

Figure 2:
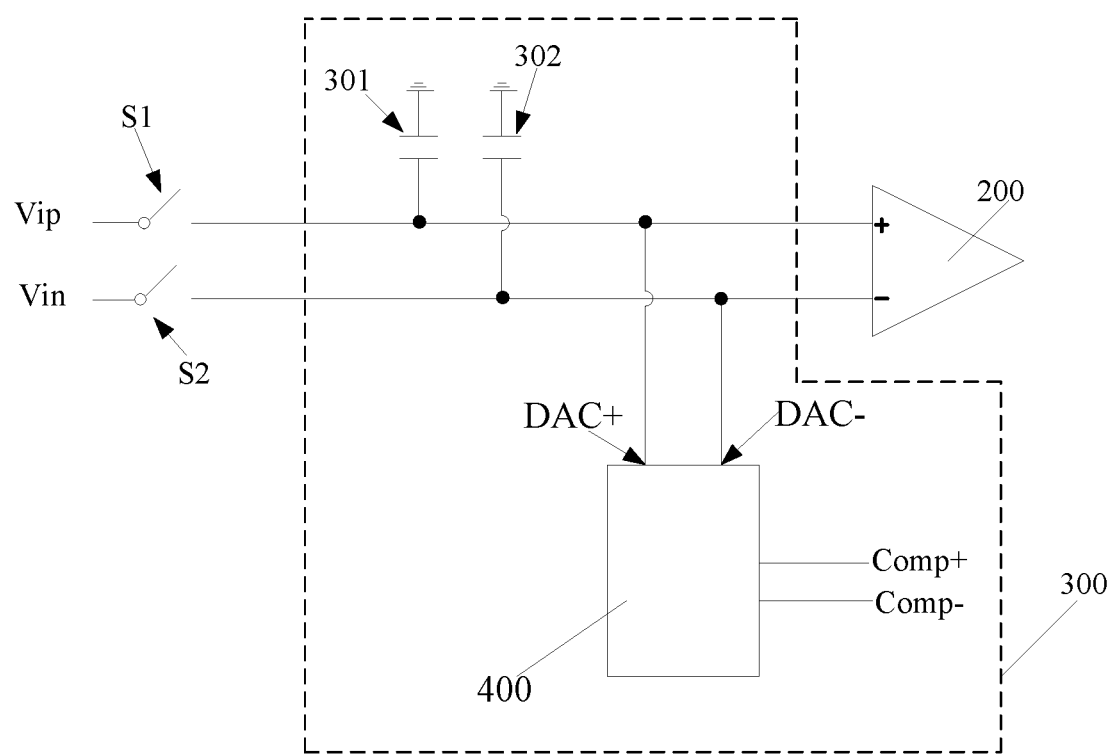
FIG. 2 illustrates an exemplary SAR-DAC device consistent with various disclosed embodiments of the present disclosure.
Figure 3:
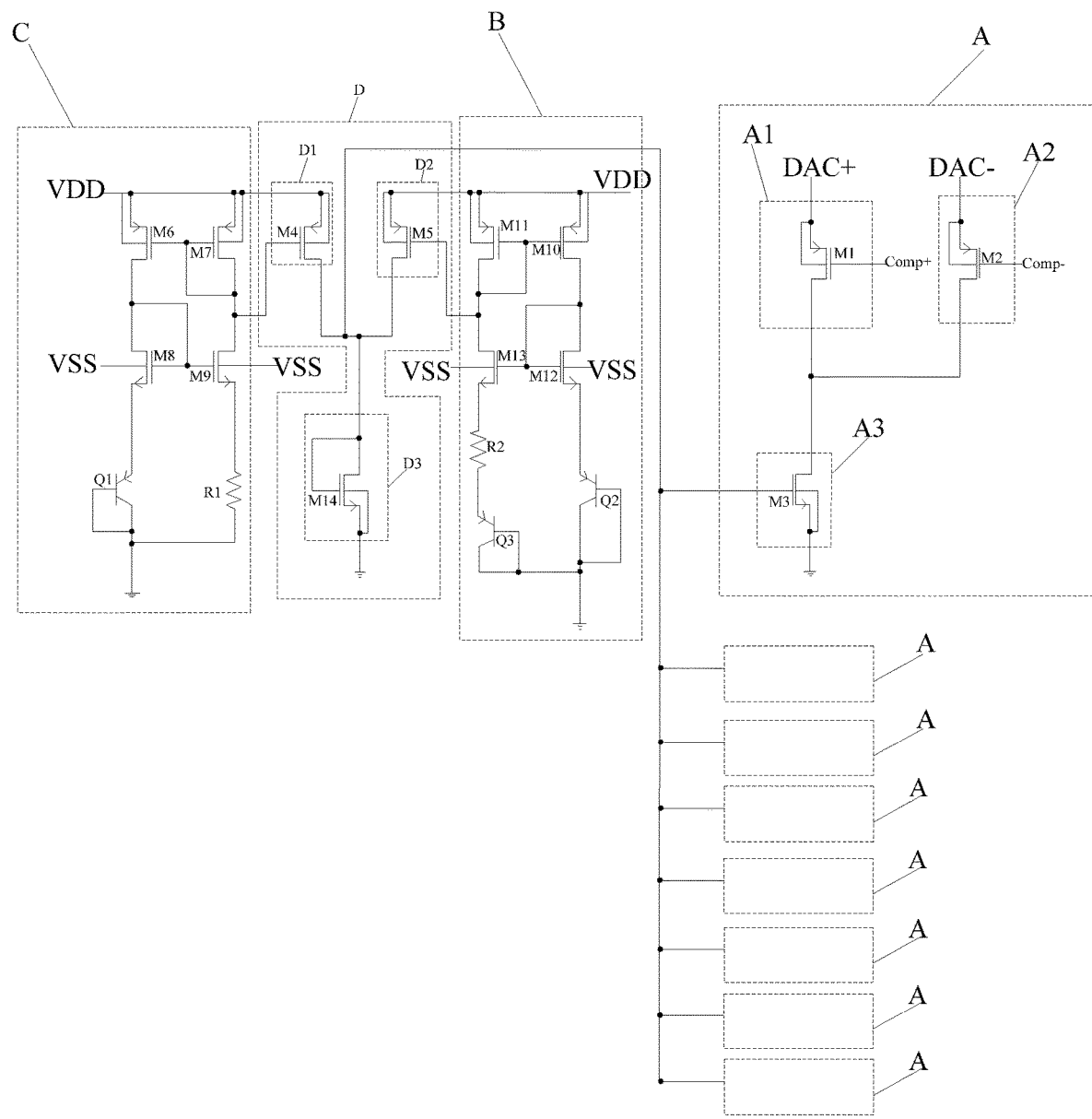
FIG. 3 illustrates an exemplary circuit of a current-controlled discharging structure in FIG. 2 consistent with various disclosed embodiments of the present disclosure.

FIG. 2 illustrates an exemplary SAR-DAC device consistent with various disclosed embodiments of the present disclosure. FIG. 3 illustrates an exemplary current-controlled discharging structure in FIG. 2.

As shown in FIG. 2, the SAR-DAC device may include a comparator 200. The comparator 200 may include a positive input terminal and a negative input terminal.

The SAR-DAC device may also include a DAC core unit 300. The DAC core unit 300 may include a first capacitor 301. The first capacitor 301 may include a first charging-discharging terminal. The first charging-discharging terminal may be connected to the positive input terminal of the comparator 200. The DAC core unit 300 may also include a second capacitor 302. The second capacitor 302 may include a second charging-discharging terminal. The second charging-discharging terminal may be connected to the negative input terminal of the comparator 200.

Further, the SAR-DAC device may include a current-controlled discharging structure 400. As shown in FIG. 3, the current-controlled discharging structure 400 may include a plurality of current beam circuit units A. Each of the plurality of current beam circuit units A may include a first discharging input terminal DAC+ and a second discharging input terminal DAC−. Each first discharging input terminal DAC+ may be connected to the first charging-discharging terminal, and each second discharging input terminal DAC− may be connected to the second charging-discharging terminal. The current-controlled discharging structure 400 may be configured to discharge the first capacitor 301 using at least a portion of the current beam circuit units A (a partial number of the plurality of current beam circuit units A) through the first discharging input terminal DAC+. The current-controlled discharging structure 400 may also be configured to discharge the second capacitor 302 using at least a portion of the current beam circuit units A through the second discharging input terminal DAC−.

In such an SAR-DAC device, the current-controlled discharging structure 400 including eight current beam circuit units A is used as an example for description. In some embodiments, the current-controlled discharging structure may include other number of current beam circuit units. In the current-controlled discharging structure 400, the structure of each current beam circuit unit A may be consistent.

Each of plurality of current beam circuit units A may include a first control unit A1, a second control unit A2, and a current beam mirroring unit A3. The first control unit A1 may be connected to the current beam mirroring unit A3, and the second control unit A2 may be connected to the current beam mirroring unit A3. The first control unit A1 may be configured to turn on/off the discharging path of the first discharging input terminal DAC+ to the current beam mirroring unit A3, and the second control unit A2 may be configured to turn on/off the discharging path of the second discharging input terminal DAC− to the current beam mirroring unit A3.

The first control unit A1 may have a first control terminal Comp+. A voltage may be applied to the first control terminal Comp+ for turning on/off the first control unit A1 to control the on/off of the discharge path of the first discharge input terminal DAC+ to the current beam mirroring unit A3.

The second control unit A2 may have a second control terminal Comp−, and a voltage may be applied to the second control terminal Comp− for turning on/off the second control unit A2 to control the on/off of the discharging path of the second discharge input terminal DAC− to the beam mirroring unit A3.

In one embodiment, the first control unit A1 may include a first MOS transistor M1. The first MOS transistor M1 may be a P-type transistor. The source terminal of the first MOS transistor M1 may be the first discharging input terminal DAC+. The gate terminal of the first MOS transistor M1 may be the first control terminal Comp+.

When the first MOS transistor M1 is turned on, the discharging path of the first discharging input terminal DAC+ to the current beam mirroring unit A3 may be turned on, and the current-controlled discharging structure 400 may discharge the first capacitor 301.

In one embodiment, the second control unit A2 may include a second MOS transistor M2. The second MOS transistor M2 may be a P-type transistor. The source terminal of the second MOS transistor M2 may be the second discharging input terminal DAC−, and the gate terminal of the second MOS transistor M2 may the second control terminal Comp−.

When the second MOS transistor M2 is turned on, the discharging path of the second discharging input terminal DAC− to the current beam mirroring unit A3 may be turned on, and the current control discharging structure 400 may discharge the second capacitor 302.

In one embodiment, the current beam mirroring unit A3 may include a third MOS transistor M3. The third MOS transistor M3 may be an N-type transistor. The drain terminal of the third MOS transistor M3 may be connected to the drain terminal of the first MOS transistor M1 and the drain terminal of the second MOS transistor M2, respectively. The source terminal of the third MOS transistor M3 may be grounded.

Further, as shown in FIG. 3, the current-controlled discharging structure 400 may further include a positive temperature-coefficient circuit unit B, a negative temperature coefficient circuit unit C, and a bias output unit D. The bias output unit D may include a first output unit D1, a second output unit D2, and a third output unit D3. The first output unit D1 may be connected to the negative temperature-coefficient circuit unit C, and the second output unit D2 may be connected to the positive temperature-coefficient circuit unit B. The output terminal of the first output unit D1 and the output terminal of the second output unit D2 may be both connected to the input terminal of the third output unit D3. The first output unit D1 may be configured to output a negative temperature-coefficient current to the third output unit D3. The second output unit D2 may be configured to output a positive temperature-coefficient current to third output unit D3.

Each of the current beam circuit units A may include the current beam mirroring unit A3, and each of the current beam mirroring units A3 may be connected to the input terminal of the third output unit D3.

In one embodiment, the first output unit D1 may include a fourth MOS transistor M4. The fourth MOS transistor M4 may be a P-type transistor. The drain terminal of the fourth MOS transistor M4 may be an output terminal of the first output unit D1.

In one embodiment, the negative temperature-coefficient circuit unit C may include a sixth MOS transistor M6, a seventh MOS transistor M7, an eighth MOS transistor M8, a ninth MOS transistor M9, a first bipolar transistor Q1 and a first resistor R1. The sixth MOS transistor M6 and the seventh MOS transistor M7 may be P-type transistors. The eighth MOS transistor M8 and the ninth MOS transistor M9 may be N-type transistors. The source terminal of the sixth MOS transistor M6, the source terminal of the seventh MOS transistor M7 and the source terminal of the fourth MOS transistor M4 may be connected to a power supply line VDD. The gate terminal of the sixth MOS transistor M6, the gate terminal of the seventh MOS transistor M7, the drain terminal of the seventh MOS transistor M7, the drain terminal of the ninth MOS transistor M9 and the gate terminal of the fourth MOS transistor M4 may be connected together. The gate terminal of the eighth MOS transistor M8, the gate terminal of the ninth MOS transistor M9, the drain terminal of the eighth MOS transistor M8 and the drain terminal of the sixth MOS transistor M6 may be connected together. The source terminal of the eighth transistor M8 may be connected to the emitter terminal of the first bipolar transistor Q1. The base terminal of the first bipolar transistor Q1 may be connected to the collector terminal of the first bipolar transistor Q1. The source terminal of the ninth MOS transistor M9 may be connected to one terminal of the first resistor R1, and the other terminal of the first resistor R1 and the collector terminal of the first bipolar transistor Q1 may be connected together and connected to the ground VSS.

The first bipolar transistor Q1 may NPN-type or PNP-type.

In one embodiment, the second output unit D2 may include a fifth MOS transistor M5. The fifth MOS transistor M5 may be a P-type transistor. The drain terminal of the fifth MOS transistor M5 may be an output terminal of the second output unit D2.

In one embodiment, the positive temperature-coefficient circuit unit B may include a tenth MOS transistor M10, an eleventh MOS transistor M11, a twelfth MOS transistor M12, a thirteenth MOS transistor M13, a second bipolar transistor Q2, a third bipolar transistor Q3 and a second resistor R2. The tenth MOS transistor M10 and the eleventh MOS transistor M11 may be P-type transistors, and the twelfth MOS transistor M12 and the thirteenth MOS transistor M13 may be N-type transistors. The source terminal of the tenth MOS transistor M10, the source terminal of the eleventh MOS transistor M11, and the source terminal of the fifth MOS transistor M5 may be connected to the power supply line VDD. The gate terminal of the tenth MOS transistor M10, the gate terminal of the eleventh MOS transistor M11, the drain terminal of the eleventh MOS transistor M11, the drain terminal of the thirteenth MOS transistor M13, and the gate terminal of the fifth MOS transistor M5 may be connected together. The gate terminal of the twelfth MOS transistor M12, the gate terminal of the thirteenth MOS transistor M13, the drain terminal of the twelfth MOS transistor M12 and the drain terminal of the tenth MOS transistor M10 may be connected together. The source terminal of the twelfth MOS transistor M12 may be connected to the emitter terminal of the second bipolar transistor Q2. The base terminal of the second bipolar transistor Q2 and the collector terminal of the second bipolar transistor Q2 may be connected together. The source terminal of the thirteenth MOS transistor M13 may be connected to one terminal of the second resistor R2. The other terminal of the second resistor R2 may be connected to the emitter terminal of the third bipolar transistor Q3, and the base terminal of the third bipolar transistor Q3 may be connected to the collector terminal of the third bipolar transistor Q3. The collector terminal of the second bipolar transistor Q2 and the collector terminal of the third bipolar transistor Q3 may be grounded.

The second bipolar transistor Q2 may NPN-type or PNP-type, and the third bipolar transistor Q3 may NPN-type or PNP-type. In one embodiment, the second bipolar transistor Q2 is PNP-type, and the third bipolar transistor Q3 is PNP-type.

In one embodiment, the third output unit D3 may include a fourteenth MOS transistor M14; and the fourteenth MOS transistor M14 may be an N-type transistor. The drain terminal of the fourteenth MOS transistor M14 may be an input terminal of the third output unit D3. The gate terminal of the fourteenth MOS transistor M14 may be connected to the drain terminal of the fourteenth MOS transistor M14, and the source terminal of the fourteenth MOS transistor M14 may be grounded.

The third output unit D3 and the current beam mirroring unit A may be current mirrors, and the current in the third output unit D3 may be mirrored into each current beam mirroring unit A.

The gate terminal of the third MOS transistor M3 may be connected to the input terminal of the third output unit D3.

In one embodiment, the gate terminal of the third MOS transistor M3 may be connected to the drain terminal of the fourteenth MOS transistor M14.

Further, as shown in FIG. 2, in one embodiment, the SAR-DAC device may further include a first sampling switch S1 and a second sampling switch S2. The first sampling switch S1 may be connected to the first charging-discharging terminal, and the first sampling switch S1 may be configured to output a first sampling signal Vip when it is turned on. The second sampling switch S2 may be connected to the second charging-discharging terminal, and the second sampling switch S2 may be configured to output a second sampling signal Vip when it is turned on. The first sampling switch S1 may be turned on to charge the first capacitor 301; and the second sampling switch S2 may be turned on to charge the second capacitor 302.

In one embodiment, the capacitance of the first capacitor 301 may be approximately equal to the capacitance of the second capacitor 302. In particular, the capacitance of the first capacitor 301 may be in range of approximately 0.3 pF-0.7 pF, such as 0.5 pF; and the capacitance of the second capacitor 302 may be in a range of approximately 0.3 pF-0.7 pF, such as 0.5 pF.

The first capacitor 301 may also include a first capacitor terminal opposing to the first charge-discharging terminal; and the first capacitor terminal may be grounded. The second capacitor 302 may also include a second capacitor terminal opposing to the second charge-discharging terminal, and the second capacitor terminal may be grounded.

Figure 4:
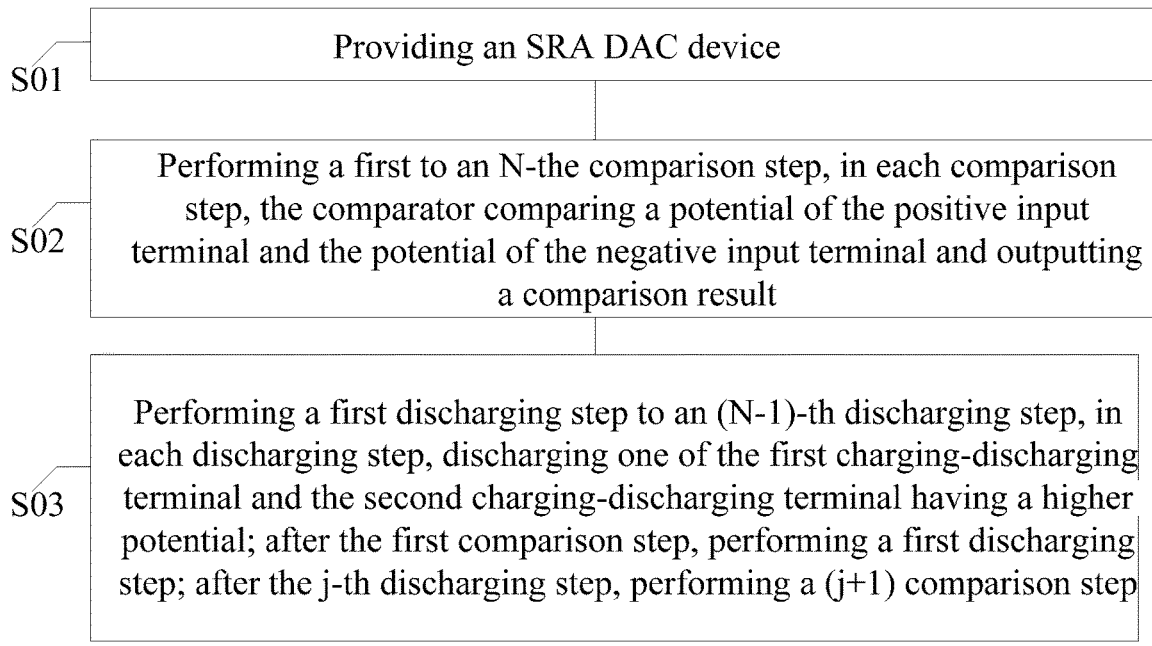
FIG. 4 illustrates a flow-chart of an operation of an exemplary SAR-DAC consistent with various disclosed embodiments of the present disclosure.

The present disclosure also provides an operating method of an SAR-DAC device. FIG. 4 illustrates a flow chart of an exemplary operating method of an SAR-DAC device consistent with various disclosed embodiments.

As show in FIG. 4, the method may include:

S01: providing an SAR-DAC device. The SAR-DAC device may be a disclosed SAR-DAC device illustrated in FIGS. 2-3;

S02: performing a first comparison step to an N-th comparison step. In each comparison step, the comparator 200 may compare the potential of the positive input terminal with the potential of the negative input terminal, and output a comparison result. N is an integer greater than or equal to 2; and S03: performing a first discharging step to an (N−1)th discharging step. In each discharging step, one of the first charging-discharging terminal and the second charging-discharging terminal having a higher potential may be discharged. After performing the first comparison step, the first discharging step may be performed. After a j-th discharging step, the (j+1)th comparison step may be performed. j is an integer greater than or equal to 1 and less than or equal to N−1. In the current-controlled discharging structure 400, the total number of current beam circuit units may be equal to $2^{N-2}$; and in the j-th discharging step, the number of operations using current beam circuit unit A may be $2^{N-j-1}$.

The method for operating the SAR-DAC device may further include performing a sampling step. The sampling step may include charging the first capacitor 301 such that the first charging-discharging terminal may have a first initial potential. The sampling step may also include charging the second capacitor 302 such that the second charging-discharging terminal may have a second initial potential. After performing the sampling step, the first comparison step to the Nth comparison step may be performed. The first initial potential and the second initial potential may be compared in the first comparison step; and the first value assignment to the Nth value assignment may be performed.

After the i-th comparison step, the i-th value assignment may be performed according to the comparison result of the i-th comparison step. i is an integer greater than or equal to 1 and less than or equal to N. After the j-th value assignment, the j-th discharging step may be performed. After the j-th discharging step, the (j+1)th comparison step may be performed.

It should be noted that the number of operations of the current beam circuit units A used in the first discharging step to the (N−1)th discharging step may be sequentially decreased.

When the current beam circuit unit A is in operation, in particular, for the current beam circuit unit A participating in the discharging step, the discharging path of the first discharging input terminal DAC+ to the current beam mirroring unit A3 may be turned on, or the discharging path of the second discharging input terminal DAC− to the current beam mirroring unit A3 may be turned on. Only one of the discharging path of the first discharging input terminal DAC+ to the current beam mirroring unit A3 and the discharging path of the second discharging input terminal DAC− to the current beam mirroring unit A3 may be selectively turned on; and the two discharging paths may not be turned on simultaneously.

It should be noted that, in some discharging steps, portions of the current beam circuit units A may participate in the discharging, and portions of the current beam circuit units A may not participate in the discharging. For the current beam circuit units A that do not participate in the discharging, the discharging path of the first discharging input terminal DAC+ to the current beam mirroring unit A3 may be turned off, and the discharging path of the second discharging input terminal DAC− to the current beam mirroring unit A3 may be turned off.

It should be noted that, for the current beam circuit units A participating in the discharging, in each current beam circuit unit A, the discharging path of the first discharging input terminal DAC+ to the current beam mirroring unit A3 may be turned on, or in each current beam circuit unit A, the discharging path of the second discharging input terminal DAC− to the current beam mirroring unit A3 may be turned on.

Figure 5:
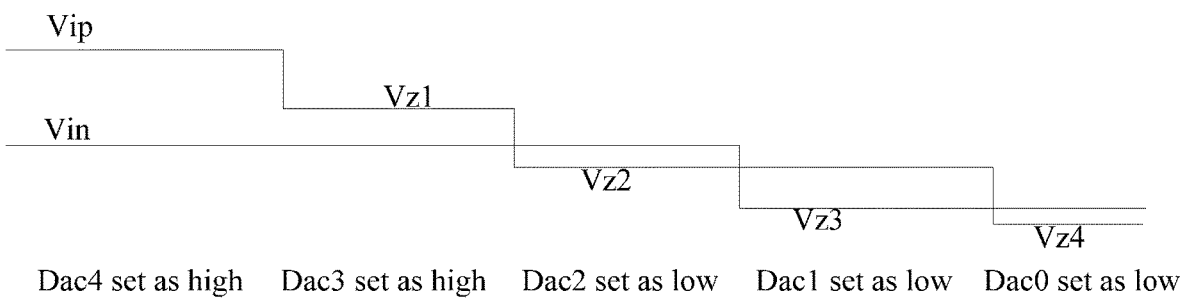
FIG. 5 illustrates an exemplary method for operating a SAR-DAC device consistent with various disclosed embodiments of the present disclosure.

In one embodiment, the operation process of the SAR-DAC device may be described by taking the data of five-bit precision as an example. FIG. 5 illustrates an exemplary operation process of an SAR-DAC device consistent with various disclosed embodiments of the present disclosure.

As shown in FIG. 5, N=5; and the five-bit precision data from the high to the low are the fifth bit dac4, the fourth bit dac3, the third bit dac2, the second bit dac1, and the first bit dac0.

A operation process of the SAR-DAC device may include performing a sampling step. In the sampling step, the first sampling switch S1 may be turned on to charge the first capacitor 301 such that the first charging-discharging terminal may have a first initial potential Vip. The second sampling switch S2 may be turned on to charge the second capacitor 302 such that the second charging-discharging terminal may have a second initial potential Vin. Then, the first sampling switch S1 and the second sampling switch S2 may be turned off. The first charging-discharging terminal may maintain the first initial potential Vip, and the second charging-discharging terminal may maintain the second initial potential Vin. After performing the sampling step, a first comparison step may be performed. In the first comparison step, the comparator 200 may compare the potentials of the negative input terminal and the positive input terminal. In particular, the comparator 200 may compare the first initial potential Vip and the second initial potential Vin, and output a first comparison result. For example, Vip may be greater than Vin. After the first comparison step, a first value assignment step may be performed according to the first comparison result of the first comparison step. For example, because Vip may be greater than Vin, the fifth digit dac4 may be set as high such that the fifth digit dac4 may be equal to 1. After the first value assignment step, a first discharging step may be performed to discharge one of the first charging-discharging terminal and the second charging-discharging terminal having a higher potential. For example, when Vip is greater than Vin, the first discharging step may discharge the first charging-discharging terminal. In the first discharging step, the number of operations of the current beam circuit unit A may be eight, and the first discharging step may cause the potential held by the first charging-discharging terminal to decrease from the first initial potential Vip to a first intermediate potential Vz1. The second charging-discharging terminal may maintain the second initial potential Vin.

After the first discharging step, a second comparison step may be performed. In the second comparison step, the comparator 200 may compare the potential of the positive input terminal with the potential of the negative input terminal. In particular, the comparator 200 may compare the first intermediate potential Vz1 and the second initial potential Vin, and output a second comparison result. For example, the first intermediate potential Vz1 may be greater than the second initial potential Vin. After the second comparison step, a second value assignment step may be performed according to the second comparison result of the second comparison step. For example, because the first intermediate potential Vz1 may be greater than the second initial potential Vin, the fourth bit dac3 may set as high such that the fourth bit dac3 may be equal to 1. After the second value assignment step, a second discharging step may be performed to discharge one of the first charging-discharging terminal and the second charging-discharging terminal having a higher potential. For example, the first intermediate potential Vz1 may be greater than the first initial potential Vin, the second discharging step may discharge the first charging-discharging terminal. In the second discharging step, the number of operations using the current beam circuit unit A may be four, and the second discharging step may cause the potential maintained at the first charging-discharging terminal to be decreased from the first intermediate potential Vz1 to a second intermediate potential Vz2. The second charging-discharging terminal may maintain the second initial potential Vin.

After the second discharging step, a third comparison step may be performed. In the third comparison step, the comparator 200 may compare the potential of the positive input terminal with the potential of the negative input terminal. In particular, the comparator 200 may compare the second intermediate potential Vz2 and the second initial potential Vin, and output a third comparison result. For example, the second intermediate potential Vz2 may be smaller than the second initial potential Vin. After the third comparison step, a third value assignment step may be performed according to the third comparison result of the third comparison step. For example, because the second intermediate potential Vz2 may be smaller than the second initial potential Vin, the third bit dac2 may set as low such that the third bit dac2 may be equal to 0. After the third value assignment step, a third discharging step may be performed to discharge one of the first charging-discharging terminal and the second charging-discharging terminal having a higher potential. For example, the first second potential Vz2 may be smaller than the second initial potential Vin, the third discharging step may discharge the second charging-discharging terminal. In the third discharging step, the number of operations using the current beam circuit unit A may be two, and the third discharging step may cause the potential maintained at the second charging-discharging terminal to be decreased from the second initial potential Vin to a third intermediate potential Vz3. The first charging-discharging terminal may maintain the second initial potential Vin.

After the third discharging step, a fourth comparison step may be performed. In the fourth comparison step, the comparator 200 may compare the potential of the positive input terminal with the potential of the negative input terminal. In particular, the comparator 200 may compare the second intermediate potential Vz2 and the third intermediate potential Vz3, and output a fourth comparison result. For example, the second intermediate potential Vz2 may be greater than the third intermediate potential Vz3. After the fourth comparison step, a fourth value assignment step may be performed according to the fourth comparison result of the fourth comparison step. For example, because the second intermediate potential Vz1 may be greater than the third intermediate potential Vz3, the second bit dac1 may set as high such that the second bit dac1 may be equal to 1. After the fourth value assignment step, a fourth discharging step may be performed to discharge one of the first charging-discharging terminal and the second charging-discharging terminal having a higher potential. For example, the second intermediate potential Vz2 may be greater than the third intermediate potential Vz3, the fourth discharging step may discharge the first charging-discharging terminal. In the fourth discharging step, the number of operations using the current beam circuit unit A may be one, and the fourth discharging step may cause the potential maintained at the first charging-discharging terminal to be decreased from the second intermediate potential Vz2 to a fourth intermediate potential Vz4. The second charging-discharging terminal may maintain the third intermediate potential Vz3.

After the fourth discharging step, a fifth comparison step may be performed. In the fifth comparison step, the comparator 200 may compare the potential of the positive input terminal with the potential of the negative input terminal. In particular, the comparator 200 may compare the fourth intermediate potential Vz4 and the third intermediate potential Vz3, and output a fifth comparison result. For example, the fourth intermediate potential Vz4 may be smaller than the third intermediate potential Vz3. After the fifth comparison step, a fifth value assignment step may be performed according to the fifth comparison result of the fifth comparison step. For example, because the fourth intermediate potential Vz4 may be greater than the third intermediate potential Vz3, the first bit dac0 may set as low such that the first bit dac0 may be equal to 0.

Because the current-controlled discharging structure 400 may include the positive temperature-coefficient circuit unit B and the negative temperature-coefficient circuit unit C, the first output unit D1 may be connected to the negative temperature-coefficient circuit unit C, and the second output unit D2 may be connected to the positive temperature-coefficient circuit unit B, the first output unit D1 may output a negative temperature-coefficient current $I_c$, and the second output unit D2 may output a positive temperature-coefficient current $I_p$. The output terminal of the first output unit D1 and the output terminal of the second output unit D2 may be both connected to the input terminal of the third output unit D3, and the first output unit D1 may output the negative temperature-coefficient current $I_c$ to the third output unit D3, and the second output unit D2 may output the positive temperature-coefficient current $I_p$ to the third output unit D3. Thus, the current $I_b$ at the input terminal of the third output unit D3 may be a current substantially independent of temperature.

In one embodiment, the current passing through the fourth MOS transistor M4 may be $I_c$, the current passing through the fifth MOS transistor M5 may be $I_p$, and the current passing through the fourteenth transistor M14 may be $I_b$.

In particular, $I_c = aV_{be(Q1)}/R1$. a is the first current mirroring coefficient, and $V_{be(Q1)}$ is the voltage between the base terminal and the emitter terminal of the first bipolar transistor Q1.

In one embodiment, a is the ratio between the channel width-to-length ratio of the fourth MOS transistor M4 to the channel width-to-length ratio of the seventh MOS transistor M7.

Further, $I_p = b(V_{be(Q3)} - V_{be(Q2)})/R2$. b is the second current mirroring coefficient, $V_{be(Q3)}$ is a voltage between the base terminal and the emitter terminal of the third bipolar transistor Q3; and $V_{be(Q2)}$ is the voltage between the base terminal and the emitter terminal of the second bipolar transistor Q2.

In one embodiment, b is the ratio between the channel width-to-length ratio of the fifth MOS transistor M5 and the channel width-to-length ratio of the eleventh MOS transistor M11.

Further, $I_b = I_c + I_p$, $I_b$ is a current that is substantially independent of temperature.

Because the third output unit D3 and the current beam mirroring unit A3 may be current mirrors, $I_b$ may be mirrored into the current beam mirroring unit A3 such that the current magnitude of the current beam in the current beam mirroring unit A3 may be $I_s = cI_b$. c is the third current mirroring coefficient, and $I_s$ is a current that is substantially independent of temperature.

In one embodiment, c is the ratio between the channel width-to-length ratio of the third MOS transistor M3 and the channel width-to-length ratio of the fourteenth MOS transistor M14.

In one embodiment, the charge redistribution of the first capacitor and the second capacitor may be implemented by a current discharging process. In particular, the charging of the first capacitor and the second capacitor may be redistributed by using a unidirectional discharging of the current-controlled discharging structure 400. After each discharging step, the potentials of the first charging-discharging terminal and the second charging-discharging terminal may be compared. By using the current-controlled discharging structure 400, the capacitance matrix in the SAR-DAC device may be significantly reduced, and there may be a significant advantage in the layout. Accordingly, the layout area may be significantly reduced and the production cost may be reduced as well. At the same time, the first capacitor and the second capacitor with smaller capacitances may be used, and the first capacitor and the second capacitor may be discharged by the method of current discharging. Thus, the speed of the SAR-DAC device may be increased. Secondly, the current magnitude $I_s$ of the current beam in the current beam mirroring unit A3 may be a current substantially independent of temperature, and the current in the current beam in the current beam mirroring unit A3 may be substantially stable, and the accuracy of the SAR-DAC device may be improved.

In one embodiment, $I_s = C*V_{refp-n}/(2nT)$. C is the capacitance of the first capacitor or the capacitance of the second capacitor. $V_{refp-n}$ is the differential voltage of the reference voltage of the SAR-DAC device. n is the number of the bits of the output data. For example, for five-bit precision data, n is equal to 5. T is the period corresponding to the switching frequency of the SAR-DAC device.

In a specific embodiment, C=0.5 pF, and $V_{refp-n}$=1V. The conversion frequency of the SAR-DAC is 200 MHz, T=0.5 ns, n=5, then $I_s$=31.25 µA, and the change of $I_s$ is ±446 nA, the error of $I_s$ is 1.4%.

The SAR-DAC device in the present disclosure may be able to reduce the layout area of the capacitance matrix to 1/32 of the original layout area while increasing the speed by 100 times.

In the disclosed SAR-DAC device, the charge redistribution of the first capacitor and the second capacitor may be implemented by a current discharging process. In particular, the charging of the first capacitor and the second capacitor may be redistributed by using a unidirectional discharging of the current-controlled discharging structure. After each discharging step, the potentials of the first charging-discharging terminal and the second charging-discharging terminal may be compared. By using the current-controlled discharging structure, the capacitor matrix in the SAR-DAC device may be significantly reduced, and there may be a significant advantage in the layout. Accordingly, the layout area may be significantly reduced; and the production cost may be reduced as well. At the same time, the first capacitor and the second capacitor with smaller capacitances may be used, and the first capacitor and the second capacitor may be discharged by the method of current discharging. Thus, the speed of the SAR-DAC device may be increased; and the performance of the SAR-DAC device may be improved.

Further, because the current-controlled discharging structure may include a positive temperature-coefficient circuit unit and a negative temperature-coefficient circuit unit. The first output unit may be connected to the negative temperature-coefficient circuit unit, and the second output unit may be connected to the positive temperature-coefficient circuit unit. Thus, the first output unit may be able to output a negative temperature-coefficient current, and the second output unit may be capable of outputting a positive temperature-coefficient current. The output terminal of the first output unit and the output terminal of the second output unit may be both connected to the input terminal of the third output unit. The first output unit may output a negative temperature coefficient current to the third output unit, and the second output unit may output a positive temperature coefficient current to the third output unit. Thus, the current at the input terminal of the third output unit may be substantially independent of temperature. Because the third output unit and the current beam mirroring unit may be current mirrors, the current at the input terminal of the third output unit may be mirrored into the current beam mirroring unit such that the current of the current beam in the current beam mirroring unit may be a current independent of temperature. Accordingly, the current in the current beam in the current beam mirroring unit may be substantially stable; and the accuracy of the SAR-DAC device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A successive approximation digital-to-analog converter (SAR-DAC) device, comprising:
a comparator having a positive input terminal and a negative input terminal; and
a DAC core unit including a first capacitor, a second capacitor, and a current-controlled discharging structure,
wherein:
the first capacitor includes a first charging-discharging terminal connected to the positive input terminal;
the second capacitor includes a second charging-discharging terminal connected to the negative input terminal;
the current-controlled discharging structure includes a plurality of current beam circuit units;
each of the plurality of current beam circuit units includes a first discharging input terminal and a second discharging input terminal;
each first discharging input terminal is connected to the first charging-discharging terminal;
each second discharging input terminal is connected to the second charging-discharging terminal;
the current-controlled discharging structure is configured to discharge the first capacitor through the first discharging input terminal by using at least a portion of the current beam circuit units; and
the current-controlled discharging structure is further configured to discharge the second capacitor through the second discharging input terminal using at least a portion of the current beam circuit units.

2. The device according to claim 1, wherein each current beam circuit unit comprises:
a first control unit;
a second control unit; and
a current beam mirroring unit,
wherein:
the first control unit is connected to the current beam mirroring unit;
the second control unit is connected to the current beam mirroring unit;
the first control unit is configured to control an on/off of a discharging path of the first discharging input terminal to the current beam mirroring unit; and
the second control unit is configured to control an on/off of a discharging path of the second discharging input terminal to the current beam mirroring unit.

3. The device according to claim 2, wherein:
the first control unit includes a first MOS transistor;
the first MOS transistor is a P-type transistor;
a source terminal of the first MOS transistor is the first discharging input terminal;
the second control unit includes a second MOS transistor;
the second MOS transistor is a P-type transistor;
a source terminal of the second MOS transistor is the second discharging input terminal;
the current beam mirroring unit includes a third MOS transistor;
the third MOS transistor is an N-type transistor;
a drain terminal of the third MOS transistor is connected to a drain terminal of the first MOS transistor and a drain terminal of the second MOS transistor, respectively; and
a source terminal of the third MOS transistor is grounded.

4. The device according to claim 1, wherein:
the current-controlled discharging structure includes a positive temperature-coefficient circuit unit, a negative temperature-coefficient circuit unit, and a bias output unit;
the bias output unit includes a first output unit, a second output unit, and a third output unit;
the first output unit is connected to the negative temperature-coefficient circuit unit;
the second output unit is connected to the positive temperature-coefficient circuit unit;
an output terminal of the first output unit and an output terminal of the second output unit are connected to an input terminal of the third output unit;
the first output unit is configured to output a negative temperature-coefficient current to the third output unit;
the second output unit is configured to output a positive temperature-coefficient current to the third output unit;
each current beam circuit unit includes a current beam mirroring unit;
each current beam mirroring unit is connected to the input terminal of the third output unit;
the third output unit and the current beam mirroring unit are current mirrors; and
a current in the third output unit is mirrored in each current beam mirroring unit.

5. The device according to claim 4, wherein:
the first output unit includes a fourth MOS transistor;
the fourth MOS transistor is a P-type transistor;
a drain terminal of the fourth MOS transistor is an output terminal of the first output unit;
the negative temperature-coefficient circuit unit includes a sixth MOS transistor, a seventh MOS transistor, an eighth MOS transistor, a ninth MOS transistor, a first bipolar transistor, and a first resistor;
the sixth MOS transistor and the seventh MOS transistor are P-type transistors;
the eighth MOS transistor and the ninth MOS transistor are N-type transistors;
a source terminal of the sixth MOS transistor, a source terminal of the seventh MOS transistor and a source terminal of the fourth MOS transistor are connected to a power supply line;
a gate terminal of the sixth MOS transistor, a gate terminal of the seventh MOS transistor, a drain terminal of the seventh MOS transistor, a drain terminal of the ninth MOS transistor, and a gate terminal of the fourth MOS transistor are connected together;
a gate terminal of the eighth MOS transistor and a gate terminal of the ninth MOS transistor, a drain terminal of the eighth MOS transistor and a drain terminal of the sixth MOS transistor are connected together;
a source terminal of the eighth MOS transistor is connected to an emitter terminal of the first bipolar transistor;
a base terminal of the first bipolar transistor is connected to a collector terminal of the first bipolar transistor;
a source terminal of the ninth MOS transistor is connected to one terminal of the first resistor; and
another terminal of the first resistor and a collector terminal of the first bipolar transistor are grounded.

6. The SAR-DAC device according to claim 4, wherein:
the second output unit includes a fifth MOS transistor;
the fifth MOS transistor is a P-type transistor;
a drain terminal of the fifth MOS transistor is an output terminal of the second output unit;

the positive temperature-coefficient circuit unit includes a
tenth MOS transistor, an eleventh MOS transistor, a
twelfth MOS transistor, a thirteenth MOS transistor, a
second bipolar transistor, a third bipolar transistor; and
a second resistor;
the tenth MOS transistor and the eleventh MOS transistor
are P-type transistors;
the twelfth MOS transistor and the thirteenth MOS transistor are N-type transistors;
a source terminal of the tenth MOS transistor, a source of
the eleventh MOS transistor, and a source terminal of
the fifth MOS transistor are connected to the power
supply line;
a gate terminal of the tenth MOS transistor, a gate
terminal of the eleventh MOS transistor, a drain terminal of the eleventh MOS transistor, a drain terminal of
the thirteenth MOS transistor and a gate terminal of the
fifth MOS transistor are connected together;
a gate terminal of the twelfth MOS transistor, a gate
terminal of the thirteenth MOS transistor, a drain
terminal of the twelfth MOS transistor and a drain
terminal of the tenth MOS transistor are connected
together;
a source terminal the twelfth MOS transistor is connected
to an emitter terminal of the second bipolar transistor;
a base terminal of the second bipolar transistor is connected to a collector terminal of the second bipolar
transistor;
a source terminal of the thirteenth MOS transistor is
connected to one terminal of the second resistor;
another terminal of the second resistor is connected to an
emitter terminal of the third bipolar transistor;
a base terminal of the third bipolar transistor is connected
to a collector terminal of the third bipolar transistor;
and
a collector terminal of the second bipolar transistor and a
collector terminal of the third bipolar transistor are
grounded.

7. The SAR-DAC device according to claim 4, wherein:
the third output unit includes a fourteenth MOS transistor;
the fourteenth MOS transistor is an N-type transistor;
a drain terminal of the fourteenth MOS transistor is an
input terminal of the third output unit;
a gate terminal of the fourteenth MOS transistor is connected to a drain terminal of the fourteen MOS transistor; and
a source terminal of the fourteenth MOS transistor is
grounded.

8. The SAR-DAC device according to claim 1, further
comprising:
a first sampling switch, connected to the first charging-discharging terminal and configured to output a first
sampling signal when being turned on; and
a second sampling switch, connected to the second charging-discharging terminal and configured to output a
second sampling signal when being turned on.

9. The SAR-DAC device according to claim 1, wherein:
a capacitance of the first capacitor is substantially equal to
a capacitance of the second capacitor.

10. The SAR-DAC device according to claim 1, wherein:
the first capacitor includes a first capacitor terminal
opposing to the first charging-discharging terminal and
being grounded; and
the second capacitor includes a second capacitor terminal
opposing to the second charging-discharging terminal
and being grounded.

11. A method for operating an SAR-DAC device, comprising:
providing an SAR-DAC device, wherein the SAR-DAC
device includes:
a comparator having a positive input terminal and a
negative input terminal; and
a DAC core unit including a first capacitor, a second
capacitor, and a current-controlled discharging structure,
wherein:
the first capacitor includes a first charging-discharging
terminal connected to the positive input terminal;
the second capacitor includes a second charging-discharging terminal connected to the negative input
terminal;
the current-controlled discharging structure includes a
plurality of current beam circuit units;
each of the plurality of current beam circuit units
includes a first discharging input terminal and a
second discharging input terminal;
each first discharging input terminal is connected to the
first charging-discharging terminal;
each second discharging input terminal is connected to
the second charging-discharging terminal;
the current-controlled discharging structure is configured to discharge the first capacitor through the first
discharging input terminal by using at least a portion
of the current beam circuit units; and
the current-controlled discharging structure is further
configured to discharge the second capacitor through
the second discharging input terminal using at least
a portion of the current beam circuit units; and
performing a first comparison step to an N-th comparison
step, N being an integer greater than or equal to 2,
wherein:
in each comparison step, the comparator compares a
potential of the positive input terminal with a potential of the negative input terminal, and outputs a
comparison result; and
performing a first discharging step to an (N−1)-th discharging step,
wherein, in each discharging step, one of the first
charging-discharging terminal and the second charging-discharging terminal having a higher potential is
discharged,
wherein:
after the first comparison step, the first discharging step
is performed;
after the j-th discharging step, the (j+1)-th comparison
step is performed, j being an integer greater than or
equal to 1 and less than or equal to N−1;
in the current-controlled discharging structure, a total
number of current beam circuit units is equal to
2N−2; and
in the j-th discharging step, a number of operations
using the current beam circuit unit is 2N−j−1.

12. The method according to claim 11, further comprising:
performing a sampling step; and
performing a first value assignment step to an N-th value
assignment step,
wherein:
the sampling step includes charging the first capacitor to
cause the first charging-discharging terminal to have a
first initial potential and charging the second capacitor
to cause the second charging-discharging terminal to
have a second initial potential;

after the sampling step, the first comparison step to the N-th comparison step are performed;

the first initial potential and the second initial potential are compared according to the first comparison step;

after an i-th comparation step, an i-th value assignment step is performed according to a comparison result of the i-th comparison step, i being an integer greater than or equal to 1 and smaller than or equal to N; and after the j-th value assignment step, a j-th discharging step is performed.

13. The method according to claim 11, wherein each current beam circuit unit comprises:
a first control unit;
a second control unit; and
a current beam mirroring unit,
wherein:
the first control unit is connected to the current beam mirroring unit;
the second control unit is connected to the current beam mirroring unit;
the first control unit is configured to control the on/off of a discharging path of the first discharging input terminal to the current beam mirroring unit; and
the second control unit is configured to control the on/off of a discharging path of the second discharging input terminal to the current beam mirroring unit.

14. The method according to claim 13, wherein:
the first control unit includes a first MOS transistor;
the first MOS transistor is a P-type transistor;
a source terminal of the first MOS transistor is the first discharging input terminal;
the second control unit includes a second MOS transistor;
the second MOS transistor is a P-type transistor;
a source terminal of the second MOS transistor is the second discharging input terminal;
the current beam mirroring unit includes a third MOS transistor;
the third MOS transistor is an N-type transistor;
a drain terminal of the third MOS transistor is connected to a drain terminal of the first MOS transistor and a drain terminal of the second MOS transistor, respectively; and
a source terminal of the third MOS transistor is grounded.

15. The method according to claim 11, wherein:
the current-controlled discharging structure includes a positive temperature-coefficient circuit unit, a negative temperature-coefficient circuit unit, and a bias output unit;
the bias output unit includes a first output unit, a second output unit, and a third output unit;
the first output unit is connected to the negative temperature-coefficient circuit unit;
the second output unit is connected to the positive temperature-coefficient circuit unit;
an output terminal of the first output unit and an output terminal of the second output unit are connected to an input terminal of the third output unit;
the first output unit is configured to output a negative temperature-coefficient current to the third output unit;
the second output unit is configured to output a positive temperature-coefficient current to the third output unit;
each current beam circuit unit includes a current beam mirroring unit;
each current beam mirroring unit is connected to the input terminal of the third output unit;
the third output unit and the current beam mirroring unit are current mirrors; and a current in the third output unit is mirrored in each current beam mirroring unit.

16. The method according to claim 15, wherein:
the first output unit includes a fourth MOS transistor;
the fourth MOS transistor is of a P-type transistor;
a drain terminal of the fourth MOS transistor is an output terminal of the first output unit;
the negative temperature-coefficient circuit unit includes a sixth MOS transistor, a seventh MOS transistor, an eighth MOS transistor, a ninth MOS transistor, a first bipolar transistor, and a first resistor;
the sixth MOS transistor and the seventh MOS transistor are P-type transistors;
the eighth MOS transistor and the ninth MOS transistor are N-type transistors;
a source terminal of the sixth MOS transistor, a source terminal of the seventh MOS transistor and a source terminal of the fourth MOS transistor are connected to a power supply line;
a gate terminal of the sixth MOS transistor, a gate terminal of the seventh MOS transistor, a drain terminal of the seventh MOS transistor, a drain terminal of the ninth MOS transistor, and a gate terminal of the fourth MOS transistor are connected together;
a gate terminal of the eighth MOS transistor and a gate terminal of the ninth MOS transistor, a drain terminal of the eighth MOS transistor and a drain terminal of the sixth MOS transistor are connected together;
a source terminal of the eighth MOS transistor is connected to an emitter terminal of the first bipolar transistor;
the base terminal of the first bipolar transistor is connected to a collector terminal of the first bipolar transistor;
a source terminal of the ninth MOS transistor is connected to one terminal of the first resistor; and
another end of the first resistor and the collector terminal of the first bipolar transistor are grounded.

17. The method according to claim 15, wherein:
the second output unit includes a fifth MOS transistor;
the fifth MOS transistor is of a P-type transistor;
a drain terminal of the fifth MOS transistor is an output terminal of the second output unit;
the positive temperature-coefficient circuit unit includes a tenth MOS transistor, an eleventh MOS transistor, a twelfth MOS transistor, a thirteenth MOS transistor, a second bipolar transistor, a third bipolar transistor; and a second resistor;
the tenth MOS transistor and the eleventh MOS transistor are P-type transistors;
the twelfth MOS transistor and the thirteenth MOS transistor are N-type transistors;
a source terminal of the tenth MOS transistor, a source of the eleventh MOS transistor, and a source terminal of the fifth MOS transistor are connected to the power supply line;
a gate terminal of the tenth MOS transistor, a gate terminal of the eleventh MOS transistor, a drain terminal of the eleventh MOS transistor, a drain terminal of the thirteenth MOS transistor and a gate terminal of the fifth MOS transistor are connected together;
a gate terminal of the twelfth MOS transistor, a gate terminal of the thirteenth MOS transistor, a drain terminal of the twelfth MOS transistor and a drain terminal of the tenth MOS transistor are connected together;

a source terminal of the twelfth MOS transistor is connected to an emitter terminal of the second bipolar transistor;
a base terminal of the second bipolar transistor is connected to a collector terminal of the second bipolar transistor;
a source terminal of the thirteenth MOS transistor is connected to one terminal of the second resistor;
another terminal of the second resistor is connected to an emitter terminal of the third bipolar transistor;
a base terminal of the third bipolar transistor is connected to the collector terminal of the third bipolar transistor; and
a collector terminal of the second bipolar transistor and a collector terminal of the third bipolar transistor are grounded.

18. The method according to claim 15, wherein:
the third output unit includes a fourteenth MOS transistor;
the fourteenth MOS transistor is an N-type transistor;
a drain terminal of the fourteenth MOS transistor is an input terminal of the third output unit;
a gate terminal of the fourteenth MOS transistor is connected to a drain terminal of the fourteen MOS transistor; and
a source terminal of the fourteenth MOS transistor is grounded.

19. The method according to claim 11, further comprising:
a first sampling switch, connected to the first charging-discharging terminal and configured to output a first sampling signal when being turned on; and
a second sampling switch, connected to the second charging-discharging terminal and configured to output a second sampling signal when being turned on.

20. The method according to claim 11, wherein:
a capacitance of the first capacitor is substantially equal to a capacitance of the second capacitor.

* * * * *